(12) United States Patent
Ando et al.

(10) Patent No.: US 7,116,691 B2
(45) Date of Patent: Oct. 3, 2006

(54) EDGE-EMITTING TYPE SEMICONDUCTOR LASER

(75) Inventors: Masanobu Ando, Aichi (JP); Hiroshi Watanabe, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 279 days.

(21) Appl. No.: 10/766,035

(22) Filed: Jan. 29, 2004

(65) Prior Publication Data

US 2004/0247007 A1    Dec. 9, 2004

(30) Foreign Application Priority Data

Jan. 30, 2003    (JP) .............................. 2003-022113

(51) Int. Cl.
*H01S 5/20*    (2006.01)
(52) U.S. Cl. ................................... 372/45.01
(58) Field of Classification Search .............. 372/45.01
See application file for complete search history.

(56) References Cited

U.S. PATENT DOCUMENTS 4,779,280 A * 10/1988 Sermage et al. ......... 372/45.01
5,862,167 A    1/1999 Sassa et al.
6,282,345 B1 * 8/2001 Schimpe ..................... 385/50

FOREIGN PATENT DOCUMENTS

JP    10-308560    11/1998

OTHER PUBLICATIONS

"Luxpop Index of refraction values and photonics calculations", available at http:\\www.luxpop.com , accessed Jan. 18, 2006.*
Shigetoshi Ito, et al., "Transverse Modes of Ridge-Geometry Violet Laser Diodes", Sharp Technical Journal No. 77, Aug. 2000, pp. 53-57.

* cited by examiner

*Primary Examiner*—Minsun Oh Harvey
*Assistant Examiner*—Jeff Lane
(74) *Attorney, Agent, or Firm*—McGinn IP Law Group, PLLC

(57) ABSTRACT

The interval $\Lambda$ between each stripe of interference fringe generated in a conventional n-type contact layer is determined by a function $(f(\lambda)=\lambda(n^2-n_{eq}^2)^{-1/2}/2)$ wherein $\lambda$, n, and $n_{eq}$ represent luminous wavelength $\lambda$ of lights radiated from a light emitting part 104, refractive index n of the n-type contact layer, and equivalent refractive index $n_{eq}$ of the n-type contact layer in guided wave mode, respectively. The remaining thickness $\delta$ of the n-type contact layer 102 at the concave part D which is formed at the back surface of the crystal growth substrate may be about $\Lambda/2$. When at least one portion of the n-type contact layer which is formed right beneath the laser cavity remains with about $\delta$ in thickness, the n-type contact layer arranged even right beneath the laser cavity can maintain excellent contact to a negative electrode. As a result, effective light confinement enables to adequately suppress ripples in FFP owing to lights leaked into the n-type contact layer, to thereby provide a semiconductor laser which oscillates stable lights.

19 Claims, 10 Drawing Sheets

EDGE-EMITTING TYPE SEMICONDUCTOR LASER

This is a patent application based on Japanese patent application No. 2003-022113, which was filed on Jan. 30, 2003, respectively, and which is incorporated herein by reference.

BACKGROUND OF THE INVENTION

1. Field of the Invention

The present invention relates to an edge-emitting type semiconductor laser in which a laser cavity and so on are formed by depositing plural number of semiconductor layers on a crystal growth substrate. The present invention is aimed to obtain a semiconductor laser having a completed far field pattern (FFP) of output light (beam) and output characteristic of high convergence.

So a semiconductor laser fabricated in the present invention is remarkably useful in a field of, for example, information input/output processing equipment, information calculation processing equipment, communication equipment, and a laser material processing equipment.

2. Description of the Related Art

[Non-patent Document 1]

SHARP Technical Journal No. 9, No. 77, "Transverse Modes of Ridge-Geometry Violet Laser Diodes"

[Patent Document 1]

Japanese Laid-open No. H10-308560

As disclosed in the above described non-patent document 1, as specific problems of semiconductor lasers, satellite peaks in vertical light distribution and pronounced ripples in the vertical far field patterns (FFPs) are found.

FIG. 7 illustrates a sectional view of a semiconductor laser, which explains the phenomenon of ripples occurred in the far field pattern (FFP). The ripples in the far field pattern (FFP) may also occur owing to lights leaked into and transmitted in an n-type contact layer functioning as a secondary (quasi) waveguide. Such lights which generate the ripples in the far field pattern (FFP), as disclosed in the above non-patent document 1, form interference fringes in the n-type contact layer and are radiated to the outside of the layer with lights radiated from a main waveguide (active layer+guide layer).

The conventional technique disclosed in the above non-patent document 1 is aimed to suppress the ripples in the far field pattern (FFP) by forming the n-type clad layer to have at least 0.8 µm or more in thickness.

Also, the above identified related patent document 1 discloses a concave part structure formed on the back surface of a crystal growth substrate of a light-emitting semiconductor device, external quantum efficiency, endurance and productivity of the device, and prima facie effectivity of the aspects can be recognized. The patent document 1, however, fails to disclose the optimum range of a specific thickness of a semiconductor layer as the above mentioned non-patent document 1 discloses. Accordingly, the patent document 1 never suggests a concrete and effective method or process for excluding the ripples occurred in the far field pattern (FFP), with respect to an n-type contact layer in a semiconductor laser. In short, the patent document 1 never provides a concrete and effective method or process for excluding the ripples occurred in the FFP in a semiconductor laser.

As explained above, even if a semiconductor laser is manufactured in faithful accordance with the method disclosed in the patent document 1 as a trial, there is no guarantee of obtaining the semiconductor laser which has no ripples in the FFP. Accordingly, it is quite difficult to obtain a semiconductor laser which has no ripples in the FFP and oscillates light in stable condition from the prior technique disclosed in the patent document 1.

When a contact layer formed at the lower part of a laser cavity is not removed, lights are leaked from that part (the contact layer), and that prevents the device from effectively oscillating a stable laser. When the contact layer formed at the lower part of the laser cavity is moved, electrical connection between the laser cavity and a negative electrode cannot be optimum, that prevents the device from providing an excellent distribution of electric current density. Accordingly, a device which oscillates a stable laser effectively cannot be obtained.

In the meantime, as described in the non-patent document 1, some of the ripples in the FFP may be suppressed by forming an n-type clad layer to have thickness of at least 0.8 µm or more.

By employing the method disclosed in the non-patent document 1, however, unless the n-type clad layer has thickness at least from 0.8 µm to 1 µm, although it depends on condition such as compositions of each semiconductor layers, e.g., an active layer, an optical guide layer and an n-type clad layer, the interference fringe (ripples in FFP) in the n-type contact layer cannot be suppressed sufficiently. Consequently, productivity of an n-type clad layer in its crystal growth process is poor in the conventional art shown in the non-patent document 1.

Because an extremely general method in which a peak intensity of the interference fringe is weakened in accordance with thickness of the n-type clad layer is employed in the non-patent document 1, the peak intensity of the interference fringe, which is occurred by lights leaked into the n-type clad layer, may be weakened, but it cannot be disappeared completely by employing the conventional method disclosed in the non-patent document 1.

And from the viewpoints of radiation effect, inner quantum efficiency, and threshold voltage which are related with a laser cavity, forming the n-type clad layer to have thickness as much as described above is not preferable with respect to the structure for a semiconductor laser.

As other method for confining lights, forming an n-type AlGaN layer in place of the n-type clad layer made of n-GaN may be employed. According to this method, because refractive index of AlGaN is relatively small, lights may be confined in a laser cavity.

However, a problem persists in even employing such a method. Because of inner stress which is generated between semiconductor layers owing to difference of lattice constants, forming a thicker film for confining lights becomes extremely difficult, and that makes it almost impossible to manufacture a semiconductor laser.

Alternatively, other method in which the refractive index of the n-type clad layer is suppressed by doping other impurities may be applied. But when so much amount of impurities are doped that the refractive index of the n-type clad layer remarkably changes, crystallity of the n-type clad layer and semiconductor layers deposited thereon may be remarkably deteriorated, which tends to become an outstanding problem. Accordingly, it becomes almost impossible to manufacture a semiconductor laser.

SUMMARY OF THE INVENTION

Accordingly, in light of the above problems, an object of the present invention is to suppress the interference fringe of lights leaked into an n-type contact layer and to suppress the ripples in the FFP formed by the light output from the n-type contact layer more effectively compared with a conventional semiconductor laser.

The following means may be useful to overcome the above-described drawbacks.

That is, a first aspect of the present invention is an edge-emitting type semiconductor laser in which a laser cavity is formed by depositing plural semiconductor layers on a crystal growth substrate, comprising: a substrate; an n-type contact layer formed on or above the substrate; and an active layer formed on or above the n-type contact layer; wherein thickness of at least a part of the n-type contact layer which is right under the laser cavity is thinner than a value $\Lambda$ of a function of a luminous wavelength $\lambda$, determined by the formula "$\Lambda \equiv f(\lambda) = \lambda(n^2 - n_{ep}^2)^{-1/2}/2$" in which $\lambda$, n, and $n_{eq}$ are represented by: luminous wavelength in the active layer; refractive index of the n-type contact layer which depends on the luminous wavelength $\lambda$; and equivalent refractive index of the n-type contact layer in guide wave mode which depends on the luminous wavelength $\lambda$.

The refractive index of a part right under the n-type contact layer and right below the laser cavity is smaller than that of the n-type contact layer. So the light is effectively confined to the laser cavity side.

A second aspect of the present invention is an edge-emitting type semiconductor laser according to the first aspect, comprising a concave part or a cavity part which is existed right under the laser cavity. The concave part or the cavity part may be filled with proper or an arbitrary gas such as atmospheric air or inert gases.

Alternatively, as described after, a proper solid material can be inserted into the concave part or the cavity part.

The concave part or the cavity part may be formed by evaporating at least a portion of the semiconductor layer which is placed right under the laser cavity by laser irradiation.

The crystal growth substrate may not be necessarily removed by etching treatment in order to obtain such a space (the concave part or the cavity part). In this laser irradiation, focus of the laser can be narrowed to a portion, or an evaporation object (removal object) of the semiconductor, so as to locally evaporate an objective portion of the semiconductor. Both YAG and Excimer laser may be useful for this laser irradiation, however, Excimer is more preferable in order to obtain flatness of a portion after laser irradiation.

Moreover, the edge-emitting type semiconductor laser may comprise a concave part or a cavity part which reaches the n-type contact layer from the back surface of the crystal substrate and exists at least right beneath the laser cavity may also comprise a concave part.

A third aspect of the present invention is an edge-emitting type semiconductor laser in which a laser cavity is formed by depositing plural number of semiconductor layers on a crystal growth substrate, wherein a concave part is formed at the lower portion of the laser cavity by removing the crystal growth substrate and the semiconductor layers formed at least beneath the laser cavity from the back surface of the crystal growth substrate until thickness of the n-type contact layer becomes smaller than value $\Lambda$ of a function of luminous wavelength $\lambda$, which is represented by the formula: $\Lambda \equiv f(\lambda) = \lambda(n^2 - n_{eq}^2)^{-1/2}/2$, when luminous wavelength of an active layer, refractive index of an n-type contact layer which depends on the luminous wavelength $\lambda$ and equivalent refractive index of the n-type contact layer in guided wave mode which depends on the luminous wavelength $\lambda$ are represented by $\lambda$, n and $n_{eq}$, respectively.

When thickness of the n-type contact layer is less than smaller than value $\Lambda$ from the beginning of forming it may be sufficient to remove only the crystal growth substrate and other layers from the back surface of the crystal growth substrate until the bottom of the n-type contact layer (crystal growth front from which crystal growth starts) is exposed. In order to maintain excellent and sufficient crystallinity of the n-type contact layer and each semiconductor layer deposited thereon (on the upper side of the n-type contact layer), preferably and generally, thickness of the n-type contact layer may be at least $\Lambda$ or more.

In the third aspect of the present invention, not all the n-type contact layer is not removed at least in a region right beneath the laser cavity but at least one portion of the n-type contact layer should surely be left. In short, when the remained part of the n-type contact layer has thickness represented by $\delta$, relationship between $\delta$ and $\Lambda$ should be: $0 < \delta < \Lambda$.

In the concave part formed at the bottom of the laser cavity, air may be left, air may be evacuated to make the concave part vacuum, or transparent insulating materials whose refractive index is smaller than that of each semiconductor layer and inert gases may be filled.

When a plural number of semiconductor layers are deposited on the crystal growth substrate, the semiconductor layers may comprise a Group III nitride compound semiconductor. As used herein, the term Group III nitride compound semiconductor generally refers to a binary, ternary, or quaternary semiconductor having arbitrary compound crystal proportions and represented by $Al_{1-x-y}Ga_yIn_xN$ ($0 \leq x \leq 1$, $0 \leq y \leq 1$, $0 \leq 1-x-y \leq 1$). A semiconductor doped with p-type or n-type impurity is also included in a Group III nitride compound semiconductor described in the present specification.

Group III elements (Al, Ga, In) may be partially replaced with boron (B) or thallium (Tl), and nitrogen (N) atoms may be completely or partially replaced with phosphorus (P), arsenic (As), antimony (Sb), or bismuth (Bi). Such a semiconductor may also be included in "a Group III nitride compound semiconductor" in the present specification.

Examples of the aforementioned p-type impurity include magnesium (Mg) and calcium (Ca).

Examples of the aforementioned n-type impurity include silicon (Si), sulfur (S), selenium (Se), tellurium (Te), and germanium (Ge).

These impurities may be incorporated in combination of two or more species, and a p-type impurity and an n-type impurity may be incorporated in combination.

When plural number of interference fringes are generated in the n-type contact layer, each interval (spatial period) of the interference fringes is, as suggested in the non-patent document 1, equivalent to the value $\Lambda$ of a function. Accordingly, by forming the n-type contact layer to have thickness less than the value $\Lambda$ of a function, the interference fringes, i.e., peaks of the interference may not be generated in the n-type contact layer.

And because refractive index of the concave part formed at the lower part of the laser cavity is smaller than that of each semiconductor layer which is used to form the laser cavity, oscillated lights can be confined effectively in the laser cavity side of the wafer. As a result, a semiconductor laser manufactured according to the present invention oscillates lights effectively, and that enables to supply stable laser output.

When the n-type contact layer arranged right beneath the laser cavity is completely removed, distribution of electric current density tends to be ununiform and that prevents from supplying electric current effectively to the laser cavity. On the contrary, at least a part of the n-type contact layer existing right under the laser cavity may be preferably remained as in the present invention. By employing this, the n-type contact layer existing even right beneath the laser cavity can have excellent contact to a negative electrode, to thereby maintain distribution of electric current density in and around the laser cavity in excellent and ideal condition.

Accordingly, by employing the present invention, a semiconductor laser which oscillates stable lights in accordance with an ideal distribution of electric current density and an effective luminous confinement may be obtained. In addition, the interference fringes (the ripples in FFP) to be generated in the n-type contact layer can be suppressed more effectively compared with the conventional art. Because the ripples are not generated in upward and downward direction in the FFP, a semiconductor laser having such structure may be useful to precisely control the irradiation spot (irradiation region) of laser beam and to obtain a semiconductor laser having an excellent convergence and irradiation spots of smaller size.

So the semiconductor laser of the present invention may be quite useful in a field of, for example, a data input/output processing apparatus, a data calculation processing apparatus, an information communication apparatus, or a thermal machining apparatus (laser beam irradiation apparatus) which carries out laser beam irradiation.

The fourth aspect of the present invention is that a dielectric film or semiconductor film, whose refractive index is smaller than that of the n-type clad layer, is deposited at the bottom of the n-type contact layer which is exposed in the concave part of the second or third aspect of the present invention.

For example, plural number of dielectric layers or semiconductor layers may be laminated in sequence so that the refractive index of each layers decreases monotonously from the active layer side to the crystal growth substrate side. Alternatively, a dielectric film or a semiconductor film having single layer structure and refractive index which decreases consecutively and monotonously as the dielectric film or a semiconductor film reaches from the active layer side to the crystal growth substrate side may be formed. In that case, the dielectric film or a semiconductor film can provide a waveguide which reflects lights to the active layer. Alternatively, the dielectric film or a semiconductor film may be a layer comprising single layer structure and having approximately uniform refractive index.

By employing the above-described structure, luminous confinement in the laser cavity can be improved, to thereby enlarge luminous efficiency of the laser.

As a dielectric material which can be applied to a reflection film, for example, $SiO_2$ and $TiO_2$ may be used. But it is to be understood that the dielectric materials may not to be limited to only those materials. Alternatively, a reflection film may comprise semiconductor layers comprising materials represented by $Al_xGa_{1-x}N$ ($0 \leq x \leq 1$). Because refractive index of $Al_xGa_{1-x}N$ is a monotonous decreasing function of aluminum composition ratio x, aluminum composition x may function as a controlling parameter for varying refractive index of the dielectric layer step by step or continuously. For example, an $Al_xGa_{1-x}N$ semiconductor layer having single layer structure may be formed continuously at the bottom of the n-type contact layer which is exposed in the concave part in order that the refractive index of the semiconductor layer decreases monotonously from the active layer side to the crystal growth substrate side, that is, the aluminum composition ratio x of the semiconductor layer increases monotonously. Alternatively, a multiple film may be formed by discontinuously increasing aluminum composition ratio x.

Because such dielectric and semiconductor materials can effectively control absorption and transmission of lights compared with other materials such as air and metal, luminous waveguide with high energy efficiency can be obtained by employing those dielectric materials.

A fifth aspect of the present invention is to form a metal layer or a metal part at the entire part or at least one portion of the concave part according to the second or the third aspect.

Such a metal layer or a metal part effectively transmits heats generated in the laser cavity to the external part or peripheral part of the heat sink, and that contributes to a stable oscillation of the semiconductor laser. In that sense, the metal layer or the metal part may preferably comprise materials having high thermal conductivity, e.g., copper (Cu) and gold (Au). The metal layer or the metal part may also comprise an alloy made of plural metals. Also, the metal layer or the metal part may have multiple layer structure comprising different kinds of metals.

Because the metal layer or the metal part functions as a luminous reflection front, it also contributes to confine light within the laser cavity. In that sense, the metal layer or the metal part may preferably comprise at least one of materials such as aluminum (Al), rhodium (Rh), silver (Ag) and gold (Au), having high reflectivity to an objective luminous wavelength λ. An alloy in which appropriate quantities of metal each having high corrosion resistance, e.g., platinum (Pt), are mixed may be used to for the metal layer or the metal part.

By fully considering the conditions described above, proper materials may be selected to form the metal layer or the metal part. The metal layer or the metal part may of course comprise an alloy comprising plural metals. Also, the metal layer or the metal part may have multiple layer structure comprising different kinds of metals.

A sixth aspect of the present invention is to form a negative electrode by using the metal layer or the metal part of the fifth aspect of the present invention.

By employing that, a negative electrode can be obtained only by connecting a wire to the metal layer or the metal part contacted with the exposed surface of the n-type contact layer in the concave part. As a result, it becomes unnecessary to carry out etching from the uppermost layer of plural semiconductor layers to the n-type contact layer until its surface is exposed and to form a negative electrode, i.e., another metal layer or metal part on the exposed surface of the n-type contact layer. The metal layer or the metal electrode which is used to form the negative electrode may preferably have excellent ohmic property to a semiconductor.

Accordingly, by fully considering the conditions described above, proper materials may be selected to form the metal layer or the metal part. The metal layer or the metal part may of course be made of an alloy comprising plural metals. Also, the metal layer or the metal part may have multiple layer structure comprising different kinds of metals.

Because the negative electrode formed by using the metal layer or the metal part can be provided at the opposite side of the semiconductor wafer to a positive electrode, numbers of semiconductor laser chips which can be produced from one semiconductor wafer may be increased compared with those of a semiconductor wafer in which both positive and negative electrodes are formed on the same side (crystal growth side) of the wafer.

Consequently, productivity of semiconductor lasers each of which can adequately suppress the interference fringes (the ripples in the FFP) can be improved remarkably.

A seventh aspect of the present invention according to any of the first to fifth aspects of the present invention is that a negative electrode is formed on the exposed surface of the n-type contact layer whose upper surface is exposed through etching treatment from the upper side of the plural semiconductor layers, and that a semiconductor layer comprising a p-type or an undoped Group III nitride compound semiconductor is formed between the n-type contact layer and the crystal growth substrate.

By forming the undoped Group III nitride compound semiconductor layer (e.g.: GaN) between the n-type contact layer and the crystal growth substrate, electric current may be prevented from flowing into the substrate side, resulting in improving injection efficiency of electric current.

When a p-type Group III nitride compound semiconductor layer (e.g.: GaN) is formed at the interface of the n-type contact layer and the crystal growth substrate, a device such as a diode pnp junction structure without light-emitting or light-receiving function is formed at that interface. As a result, electric current is prevented from leaking, to thereby-improving voltage-withstand-characteristic of the laser device.

Such a structure may be useful especially to a conductive substrate such as an n-type silicon (Si). Alternatively, adequate result may also be obtained by applying to a general crystal growth substrate such as an undoped silicon (Si) and a sapphire substrate.

An eighth aspect of the present invention according to any one of the first to seventh aspects is that thickness δ of the n-type contact layer placed right beneath the laser cavity is in a range from $\Lambda/5$ to less than $\Lambda$. By applying such condition, the above mentioned effects may be provided with maintaining adequately excellent contact of the n-type contact layer and the negative electrode and without losing inherent functions of the n-type contact layer. In order to surely obtain the above described effects with maintaining adequately excellent contact of the n-type contact layer and the negative electrode, thickness δ of the n-type contact layer formed right beneath the laser cavity is, although it may depend on its setting accuracy (processing accuracy) and so on, preferably within a range of about $\Lambda/3 \leq \delta \leq 2\Lambda/3$ when the semiconductor laser is, for example, a bluish purple light-emitting laser.

Although it may depend on size of each part of the laser cavity such as a width of a stripe of the laser cavity or on the structure of the laser, the lower limit of the thickness δ of the n-type contact layer at which adequately excellent contact to the negative electrode can be maintained may be about 0.2 μm.

When thickness δ of the n-type contact layer formed right beneath the laser cavity is too large, the peak of interference fringes is generated in the FFP, which is not desirable. Generation of the interference fringes may be suppressed by adjusting thickness δ of the n-type contact layer smaller. But when thickness δ is too small, it becomes difficult to maintain excellent contact to the negative electrode and to obtain ideal distribution of electric current density. As a result, inner quantum efficiency deteriorates, which is not desirable.

A ninth aspect of the present invention is to form a distributed feedback structure (DFB structure), which oscillates lights along a resonance direction of the laser cavity, at at least a portion of the bottom of the n-type contact layer placed right under the laser cavity. Because the distributed feedback structure (DFB structure), which oscillates lights to a resonance direction of the laser cavity, is formed at the bottom of the n-type contact layer, laser emission becomes almost single mode. That enables to provide sharp and pure emission spectrum.

Through employment of the aforementioned aspects of the present invention, the aforementioned drawbacks can be overcome effectively and rationally.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The present invention will next be described in detail with reference to embodiments, which should not be construed as limiting the invention thereto.

First Embodiment

Figure 1:
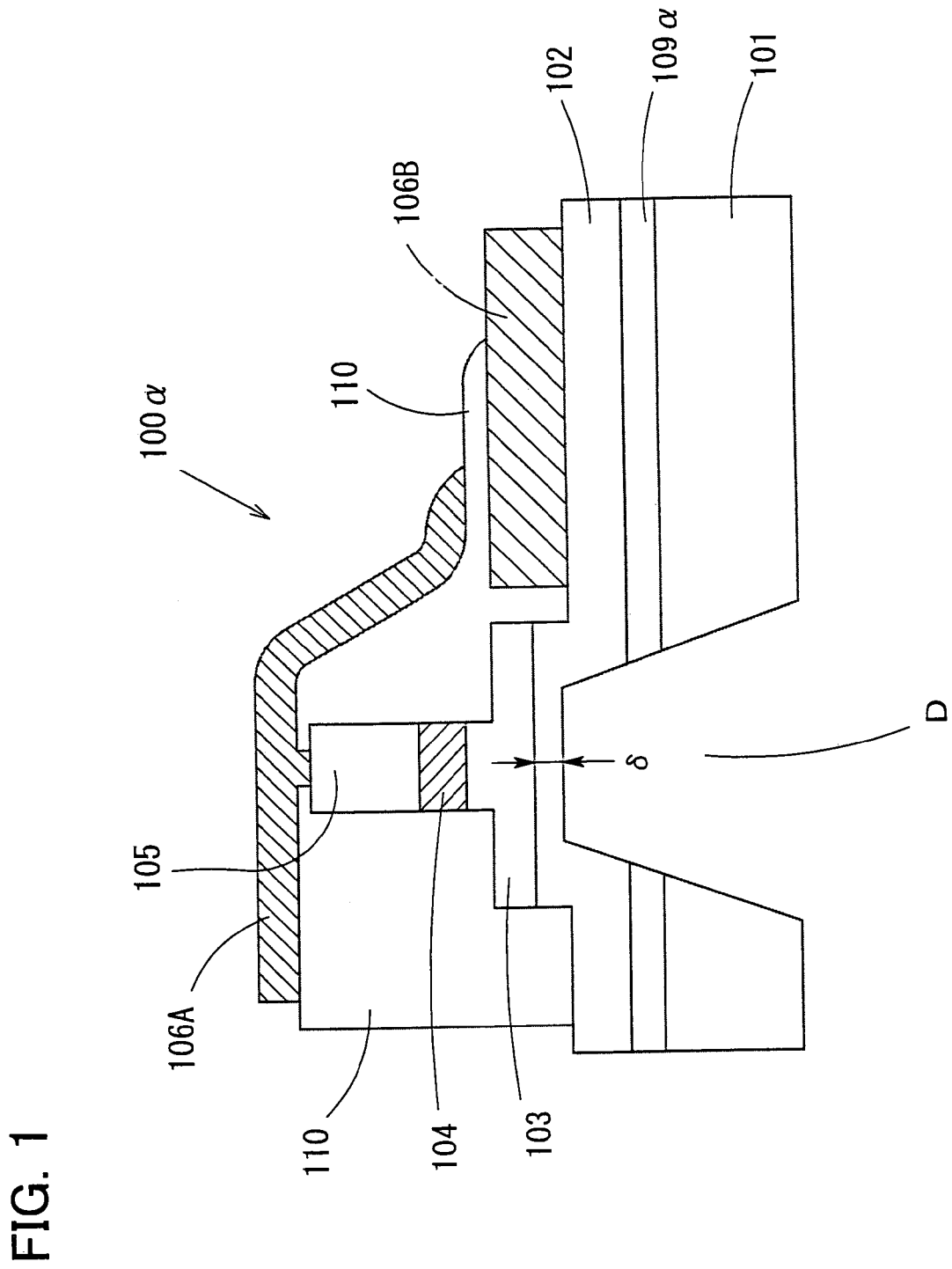
FIG. 1 is a sectional view of a semiconductor laser 100α in accordance with the first embodiment of the present invention.

FIG. 1 illustrates a sectional view of a semiconductor laser 100α in the first embodiment.

The semiconductor laser 100α has a crystal growth substrate 101 made of sapphire, and an aluminum nitride (AlN) buffer layer 109 is formed on the substrate 101. On the buffer layer 109, the following layers are formed consecutively: silicon (Si) doped gallium nitride (GaN) n-type contact layer 102, having high carrier concentration; and a GaN n-type clad layer 103.

On the n-type clad layer 103, a light emitting part 104 comprising an active layer and various types of optical guide layers formed on and below the active layer. In concrete, the light emitting part 104 comprises the following layers consecutively: an $Al_{0.01}Ga_{0.99}N$ n-type optical guide layer; an active layer having multiple quantum well (MQW) structure which is generally used in the conventional and well-known edge-emitting type laser diode; and a magnesium (Mg) doped $Al_{0.01}Ga_{0.99}N$ p-type optical guide layer.

A p-type semiconductor layer 105, in which a p-type clad layer made of p-type $Al_{0.12}Ga_{0.88}N$ and a p-type contact layer made of Mg-doped p-type GaN are deposited alternately, is formed on the light emitting part 104.

The wafer is etched from the upper side (the p-type semiconductor layer 105 side) and then most part of the n-type contact 102 is exposed. As a result of this etching treatment, a laser cavity part which is standed almost vertical to the substrate and has a flat-top surface is obtained. On both sides of the laser cavity, an insulative protection film 110 which is made of $SiO_2$ and has about 1.4 of refractive index is formed through sputtering.

A concave part D is formed on the back surface of the crystal growth substrate 101 through etching treatment. The sign "δ" represents the remaining thickness of the n-type contact layer 102 at the concave part D.

Each value of refractive index n of the n-type contact layer 102 and equivalent refractive index $n_{eq}$ of guided wave mode of the n-type contact layer 102 depends on luminous wavelength λ of lights emitted from the light emitting part 104. Luminous wavelength λ, refractive index n and equivalent refractive index $n_{eq}$ are determined by the following equations 1 to 3:

$$\lambda = 405 \text{ [nm] (blue-violet)} \qquad \text{Eq. 1}$$

$$n = 2.525 \qquad \text{Eq. 2}$$

$$n_{eq} = 2.502 \qquad \text{Eq. 3}$$

And the value Λ of a function f(λ) of luminous wavelength λ and the remaining thickness δ of the n-type contact layer at the concave part D formed on the back surface of the crystal growth substrate are represented by the following equations 4 and 5:

$$\Lambda = f(\lambda) = \lambda(n^2 - n_{eq}^2)^{-1/2}/2 \qquad \text{Eq. 4}$$
$$= 596 \text{ [nm]}$$

$$\delta = 0.30 \ [\mu] = \Lambda/2 \qquad \text{Eq. 5}$$

When the n-type contact layer placed beneath the laser cavity is completely removed, distribution of electric current density tends to be ununiform and that prevents from providing electric current effectively to the laser cavity. So at least a part of the n-type contact layer existing right under the laser cavity may be preferably remained as in the present invention. By employing this, the n-type contact layer existing even right beneath the laser cavity can have excellent contact to a negative electrode, to thereby maintain distribution of electric current density in and around the laser cavity in excellent and ideal condition.

Accordingly, by employing the above-described structure, a semiconductor laser which oscillates stable lights in accordance with an ideal distribution of electric current density and an effective luminous confinement may be obtained. In addition, interference fringes (ripples in FFP) generated by the n-type contact layer may be suppressed more effectively compared with the conventional art.

Because ripples are not generated in upward and downward direction in FFP, a semiconductor laser having such structure may be useful to precisely control the irradiation spot (irradiation region) of a laser beam and to obtain a semiconductor laser having an excellent convergence and irradiation smaller spot of the laser beam.

Considering luminous confinement, maintaining desired crystallinity, productivity of semiconductor crystals and so on, thickness of the n-type clad layer 103 deposited on the n-type contact layer 102 may be preferably 0.1 μm to 2.0 μm. Especially, when thickness of the n-type clad layer 103 is 0.4 μm to 0.8 μm, productivity of the semiconductor crystal is improved in a process of forming the n-type cladding layer 103, and further a semiconductor laser with more completed FFP and higher convergence compared with the conventional semiconductor laser can be manufactured.

In the present embodiment, the crystal growth substrate 101 is made of sapphire. Alternatively, well-known crystal growth substrate materials such as silicon, silicon carbide and gallium nitride may be used. For example, when a bulk substrate made of an undoped gallium nitride (GaN) is employed as a crystal growth substrate, a semiconductor crystal with excellent quality can be easily obtained and the buffer layer 109α may not necessarily be formed.

Other parts of the semiconductor laser 100α (FIG. 1) shown in this first embodiment, such as the structure of each part contributing to stable laser oscillation, actions and effects, are also explained hereinafter.

(1) With respect to an electrode formed on the substrate crystal, for example, a positive electrode 106A made of material in which nickel (Ni) is a main component, e.g., an alloy including nickel (Ni) and gold (Au), is deposited on a flat-top surface of the laser cavity. And a negative electrode 106B made of material in which aluminum (Al) is a main component, e.g., an alloy including aluminum (Al) and vanadium (V), is deposited on the exposed part of the n-type contact layer 102 from the upper side of the chip.

(2) By forming the insulative protection film 110 on the both sides of the laser cavity and sandwiching it, the width (thickness) of the laser cavity in horizontal direction, especially the width of the light emitting part 104 and the p-type semiconductor 105, can be remarkably small, or around 1 μm to 3 μm. As a result, high electric current concentration effect can be obtained. Also, in addition to narrow the width of the laser cavity, the both sides of the active layer are filled with insulative materials (insulative protection film 110) having small refractive index. As a result, the lights emitted from the active layer in lateral direction may be confined effectively.

(3) The positive electrode 106A formed on the flat-top surface of the laser cavity is also formed on the insulative protection film 110. Because deposition area of the positive electrode 106A is formed larger, the positive electrode 106A hardly exfoliates locally from the flat-top surface of the laser cavity. That is, the positive electrode 106A can maintain a stable condition of being deposited uniformly and adhesively on the flat-top surface of the laser cavity.

(4) Heat generated in and around the light emitting part 104 passes not only through the flat-top surface of the laser cavity but also through the insulative protection film 110 and the positive electrode 106A deposited thereon as a heat radiation channel (thermal conduction channel), and then it is radiated to a heat sink side. Here a heat sink may be attached externally when it is formed not to generate any disadvantageous short circuit (short).

For example, a heat sink may be arranged so as to contact to the exposed large area of the positive electrode 106A.

(5) In the semiconductor laser 100α, the bottom (lower part) of the laser cavity becomes wider. That is, the laser cavity is supported by the n-type clad layer 103 and the n-type contact layer 102 which are left through etching treatment at both sides lower part. Forming the flat-top surface of the laser cavity in a striped pattern each having smaller width becomes easier because such a structure physically strengthen the laser cavity. And because the insulative protection film 110 supports the laser cavity, forming the concave part D becomes easier and securer. The insulative protection film 110 is also expanded to reach a part of the flat-top surface of the laser cavity.

By employing the above-described structure, effective luminous confinement and high electric current concentration effect can be obtained.

(6) A part of the insulative protection film 110 is expanded to deposit on the negative electrode 106B, and the expanded portion of the positive electrode 106A is laminated above the negative electrode 106B through the expanded portion of the insulative protection film 110. Owing to that structure, inconvenience such that heat radiation flow concentrates to one of the positive electrode 106A and the negative electrode 106B may not occur. In other words, thermal conduction efficiency between each parts, e.g., between the positive and negative electrodes, may be enlarged and temperature difference between each parts may be decreased, to thereby provide higher heat radiation effect.

According to also the above explained operations (1) to (6), the oscillation threshold of the semiconductor laser 100α may be suppressed effectively.

For example, by employing the operations (1) to (6), a semiconductor laser, which has an effectively suppressed driving voltage and an excellent convergence and oscillates lights constantly and stably, can be obtained.

Second Embodiment

Figure 2:
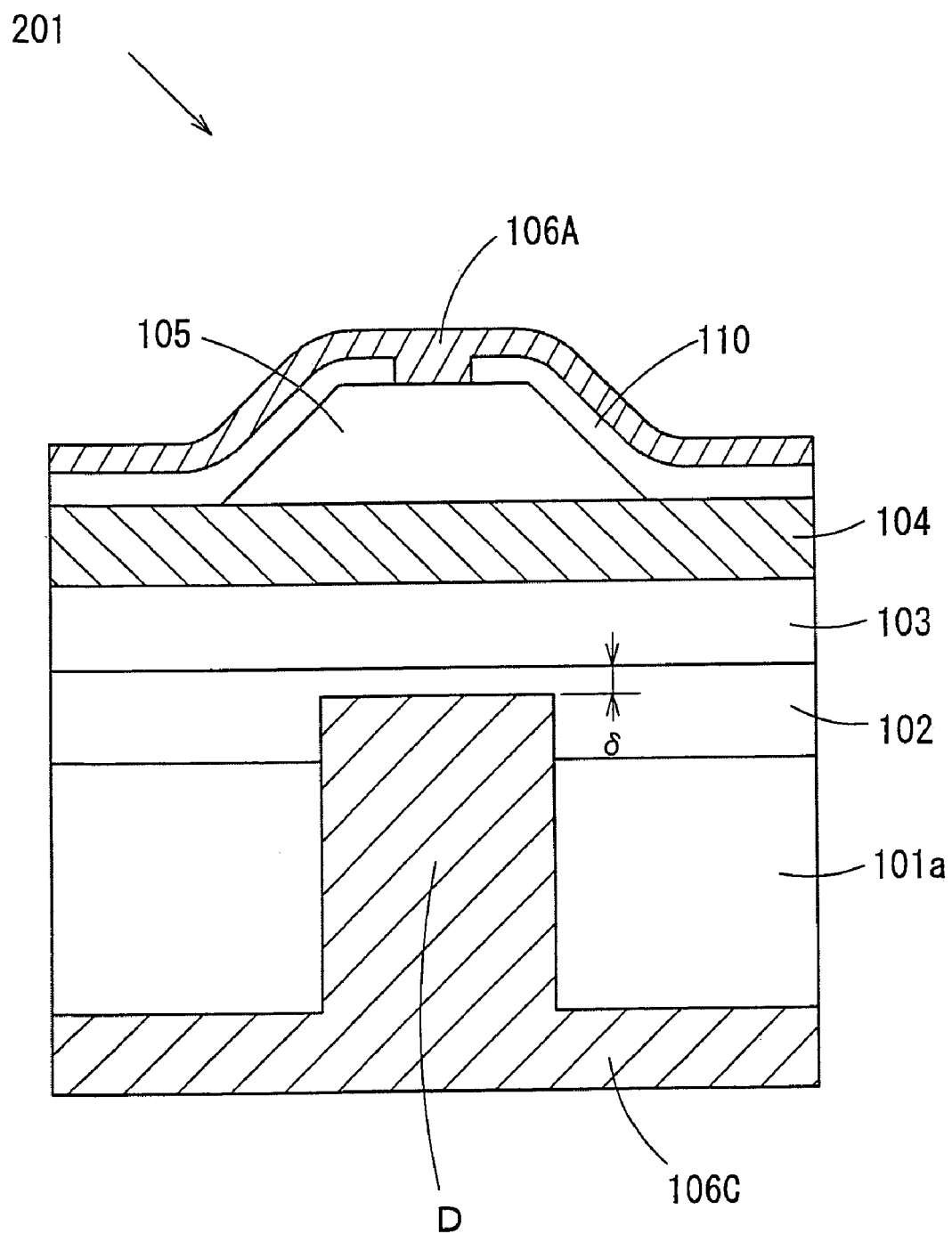
FIG. 2 is a sectional view of a semiconductor laser 201 in accordance with the second embodiment of the present invention.

FIG. 2 is a sectional view of a semiconductor laser 201 in this second embodiment. Each material (composition and material) of an n-type contact layer 102, an n-type clad layer 103, a light emitting part 104, a p-type semiconductor layer 105, an insulative protection film 110 and a positive layer 106A in the semiconductor laser 201, depositing structure (sequence of deposition and thickness of each layer) at the central part of a laser cavity may be equivalent to each layers in the semiconductor laser 100α in the first embodiment.

Also, the remaining thickness δ of the n-type contact layer 102 at the concave part D after carrying out etching treatment is also determined by the Eq.s 4 and 5 described above.

The semiconductor laser 201 shown in FIG. 2, having similar structure to that of the semiconductor laser 100α, has the following characteristics:

(1) A ridge is formed by etching the p-type semiconductor layer 105 to have a cross-sectional shape in an approximately trapezium.

(2) A bulk crystal made of a p-type or undoped GaN is applied as a material of a crystal growth substrate 101a.

(3) The concave part D described above is filled with metal in which aluminum (Al) is a main component through deposition treatment. Owing to this metal part, a light reflection part and a negative electrode 106C are formed in common.

By forming the semiconductor laser 201 to have the above described structure, lights are reflected at a light reflection front which is an interface between the n-type contact layer 102 and the metal part (the negative electrode 106C) toward the light emitting part 104, to thereby obtain excellent light confinement. And by using a p-type or undoped GaN to form the crystal growth substrate 101a, electric current does not pass through the crystal growth substrate 101a, resulting in realizing an ideal electric current concentration.

Because a bulk substrate made of a p-type or undoped gallium nitride (GaN) is employed as the crystal growth substrate, layers such as the buffer layer 109α described above may not be necessarily formed.

By employing the above described processes in this embodiment, a semiconductor laser having a completed FFP and high convergence, which continuously oscillates lights stably and effectively, can be obtained.

Third Embodiment

Figure 3:
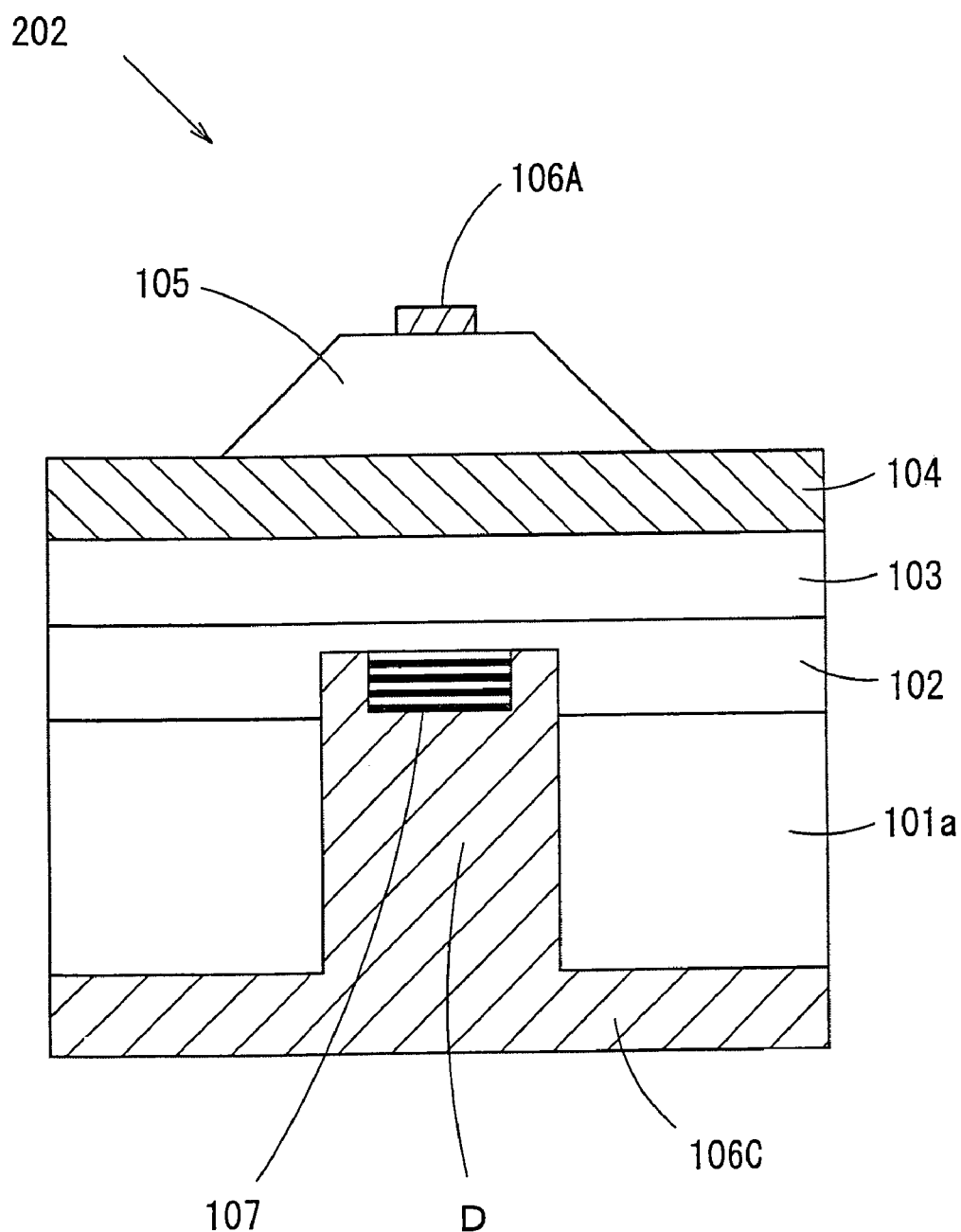
FIG. 3 is a sectional view of a semiconductor laser 202 in accordance with the third embodiment of the present invention.

FIG. 3 is a sectional view of a semiconductor laser 202 in the third embodiment of the present invention. The semiconductor laser 202 has a structure almost equivalent to that of the semiconductor laser 201 in the second embodiment, except that a semiconductor multiple film 107, whose refractive index is smaller than that of the Si-doped GaN n-type clad layer 103, is deposited at the bottom of the n-type contact layer 102 which is exposed in the concave part D in the semiconductor laser 202.

The semiconductor multiple film 107 comprising multiple layer structure is formed by depositing eight layers of semiconductor crystals in sequence on the exposed surface of the n-type contact layer 102 which is etched from the back surface of the substrate. So deposition sequence and crystal growth direction of the eight semiconductor layers of the semiconductor multiple film 107 are reverse (in downward direction) from those of the semiconductor layers such as layers 102, 103, 104 and 105.

The eight semiconductor layers of the semiconductor multiple film 107 are made of $Al_xGa_{1-x}N$ ($0 \leq x \leq 1$) and deposited through crystal growth, and each of the semiconductor layers having the following aluminum composition $x_m$ (m=1, 2, 3, ..., 8) are formed in sequence on the bottom (exposed front) of the n-type contact layer 102.

$$x_1 = 0.13,$$
$$x_2 = 0.25,$$
$$x_3 = 0.38,$$
$$x_4 = 0.50,$$
$$x_5 = 0.63,$$
$$x_6 = 0.75,$$
$$x_7 = 0.88,$$
$$x_8 = 1.00 \qquad \text{Eq. 6}$$

In order to maintain an ideal distribution of electric current density, these semiconductor crystals $Al_xGa_{1-x}N$ ($0 \leq x \leq 1$) may preferably have n-type conduction by, for example, doping Si.

By employing the above mentioned structure, lights are hardly absorbed at the light reflection surface different from the second embodiment having the light reflection surface made of metal, to thereby obtain light confinement effect with high energy efficiency. At the same time, light reflection effect may be also obtained at the metal part 106C.

According to this embodiment, a semiconductor laser having a completed FFP and high convergence, which continuously oscillates lights stably and effectively, can be obtained.

Fourth Embodiment

Figure 4:
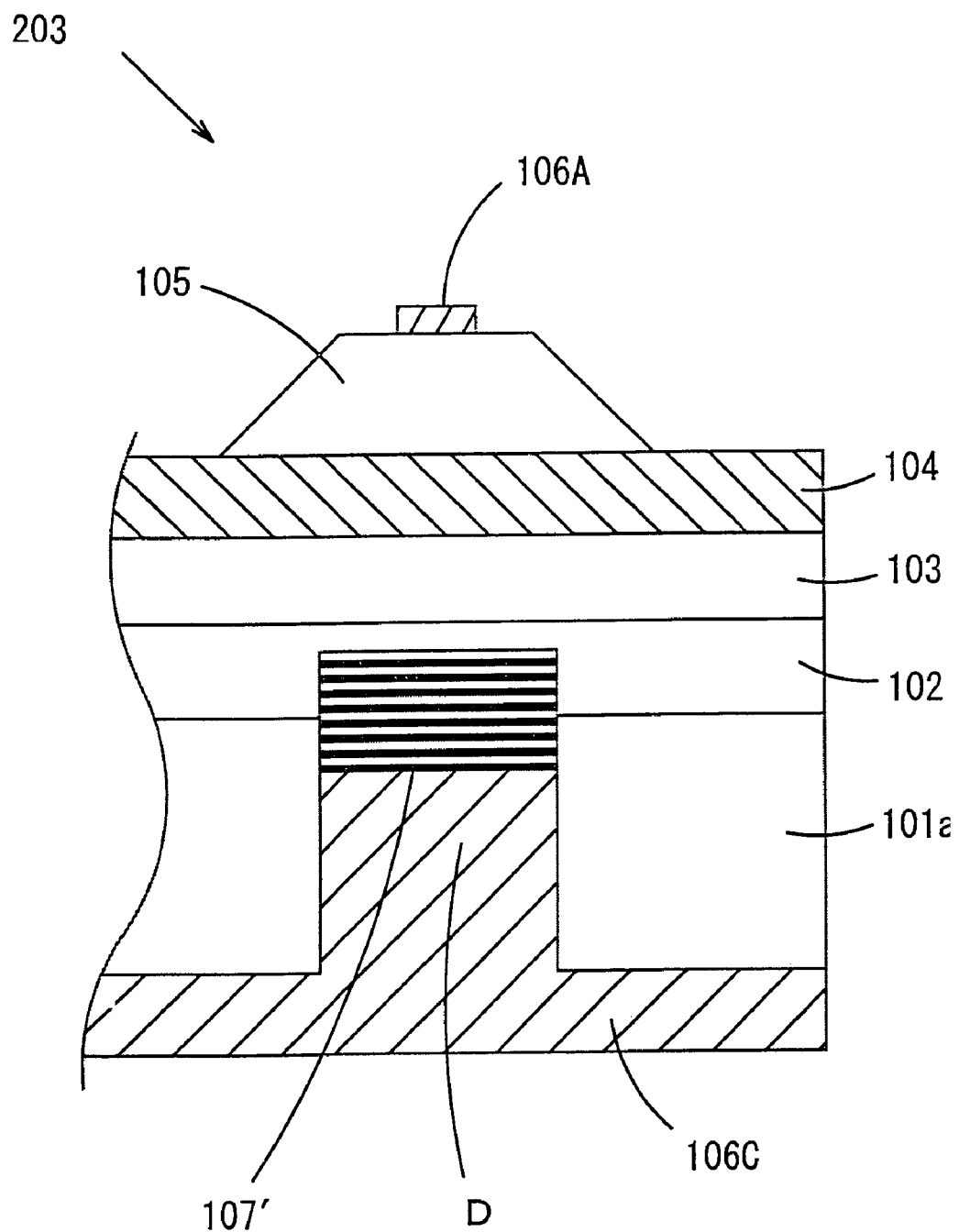
FIG. 4 is a sectional view of a semiconductor laser 203 in accordance with the fourth embodiment of the present invention.

FIG. 4 is a sectional view of a semiconductor laser 203 in the fourth embodiment of the present invention. The semiconductor laser 203 comprises almost the same structure as that of the semiconductor laser 202 in the second embodiment, except that sixteen semiconductor layers formed as a semiconductor multiple film 107' are made of $Al_xGa_{1-x}N$ (0<x≦1) and deposited through crystal growth, and each of the semiconductor layers having the following aluminum composition $x_m$ are formed in sequence on the bottom (exposed front) of the n-type contact layer 102.

$$x_m = m/16 \ (m=1, 2, 3, \ldots, 16) \quad \text{Eq. 7}$$

In order to obtain an ideal distribution of electric current density, each semiconductor layer comprised in the semiconductor multiple film 107' is preferably formed to be an n-type semiconductor crystal by highly doping an impurity to obtain n-type conductivity, e.g., Si, and the crystal growth substrate 101a is preferably made of an undoped GaN or a p-type GaN. At this time, the negative electrode 106C may also be used as an electrode.

Alternatively, the crystal growth substrate 101a and the semiconductor multiple film 107' may be formed so as not to pass electric current. Then, similar to the semiconductor laser 100α in FIG. 1, the semiconductor laser 203 can also oscillate laser by forming a negative electrode on the n-type contact layer 102 in the surface side (upper side) of the semiconductor wafer. The negative electrode 106C does not function as an electrode at this time, however, the semiconductor laser 203 may have effects similar to those in the semiconductor laser 100α: effective thermal conduction and reflectivity toward lights which are slightly leaked from the semiconductor multiple film 107'.

In order to achieve such structure, the crystal growth substrate 101a may be made of, for example, sapphire, an undoped GaN and a p-type GaN. Similarly, the semiconductor multiple film 107' may also be made of undoped or p-type semiconductor layers.

Fifth Embodiment

Figure 5:
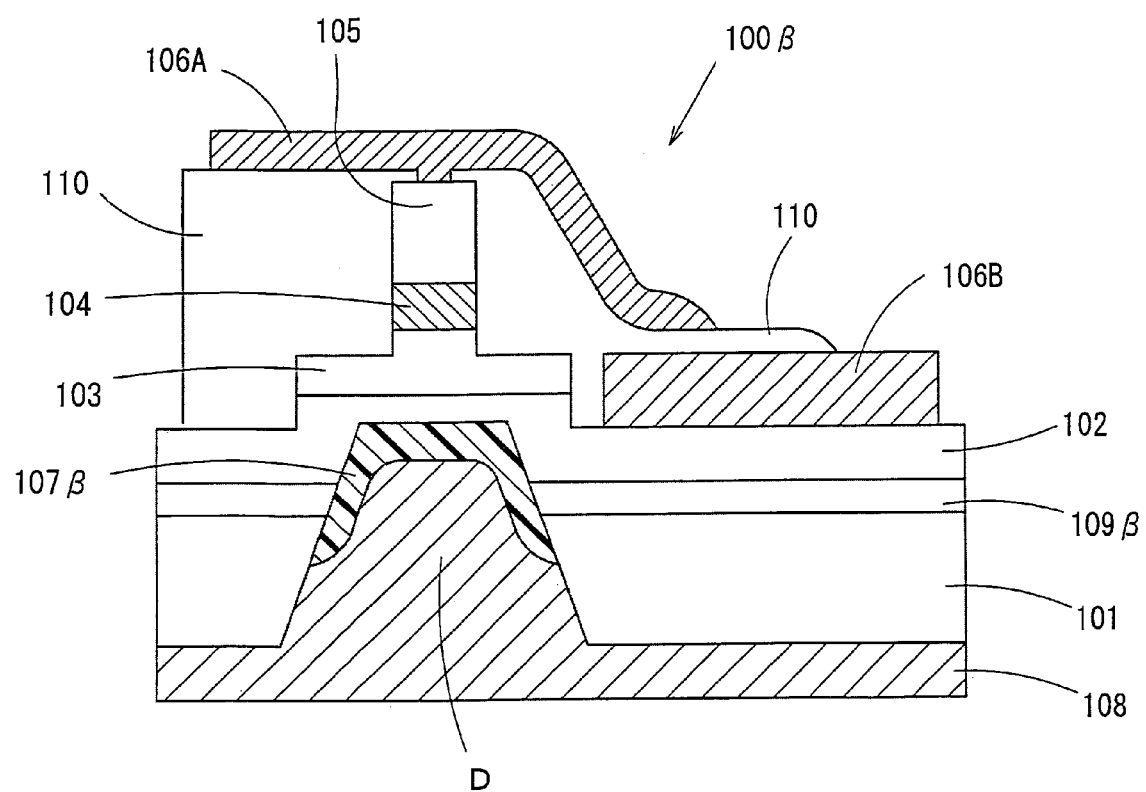
FIG. 5 is a sectional view of a semiconductor laser 100β in accordance with the fifth embodiment of the present invention.

FIG. 5 is a cross-sectional view of a semiconductor laser 100β in a fifth embodiment of the present invention. The semiconductor laser 100β is formed by partially altering the semiconductor laser 100α in the first embodiment. Differences between the semiconductor laser 100β and the semiconductor laser 100α are as follows.

(1) A semiconductor layer 109β is deposited on a sapphire substrate 101 through crystal growth. The semiconductor layer 109β comprises two layers structure, in which an AlN buffer layer and a p-type GaN layer are deposited in sequence.

(2) A dielectric layer 107β which has single layer structure and is made of $SiO_2$ is formed through sputtering at the concave part D placed at the lower part of the laser cavity. The dielectric layer 107β of single layer structure may be made of other dielectric materials such as $TiO_2$.

(3) Further, the concave part D is filled with aluminum (Al) through deposition treatment. As a result, a metal layer 108 for heat radiation is obtained.

Because the semiconductor layer 109β with two-layer structure comprises the p-type GaN layer, the heat irradiation metal layer 108 can be adequately insulated from the n-type contact layer 102. Also, because refractive index of the dielectric layer 107β is maintained lower, confinement of lights can be achieved effectively. In short, the dielectric layer 107β effectively forms a waveguide. The heat radiation metal layer 108 has excellent thermal conduction.

Figure 6:
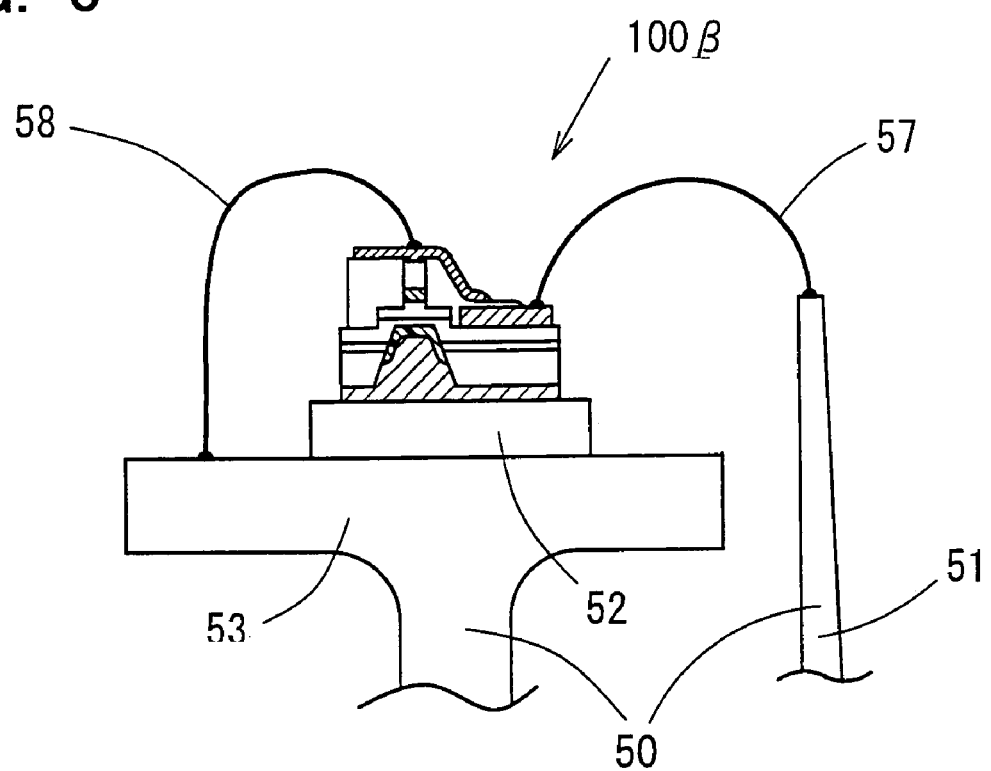
FIG. 6 is a sectional view showing mounting of a semiconductor laser 100β.

FIG. 6 is a cross-sectional view of the semiconductor laser 100β, showing the mount condition of the laser. A lead frame 50 comprises a metal stem 53, which also functions as a heat sink, and a metal post 51. A metal wire 57 attached to the metal post 51 and a metal wire 58 attached to the metal stem 53 are both made of gold (Au), and each of the metal wires 57 and 58 electrically connects the positive electrode and the negative electrode of the semiconductor laser 100β to each of the parts 51 and 53 of the lead frame 50, respectively.

In general, when producing a semiconductor laser, a diamond, which has high electrical insulation and high thermal conduction, may often be used as a material of submount and heat sink. As shown in FIG. 5 illustrating structure of the layers in the semiconductor laser 100β, however, the heat radiation metal layer 108 and the n-type contact layer 102 are adequately insulated and high withstand voltage is secured at the interface between the n-type contact layer 102 and p-type GaN layer of the semiconductor layer 109β. So both the submount 52 and the heat sink (metal stem) 53 shown in FIG. 5 can be made of a material which has high electric conduction, high thermal conduction and lower cost, e.g., copper (Cu).

Accordingly, by employing the structure of laminating semiconductor layers as shown in FIG. 5, it becomes possible or easier to achieve both reducing the cost of producing a semiconductor laser and improving its withstand voltage effectively and simultaneously as shown in FIG. 6.

Sixth Embodiment

Figure 7:
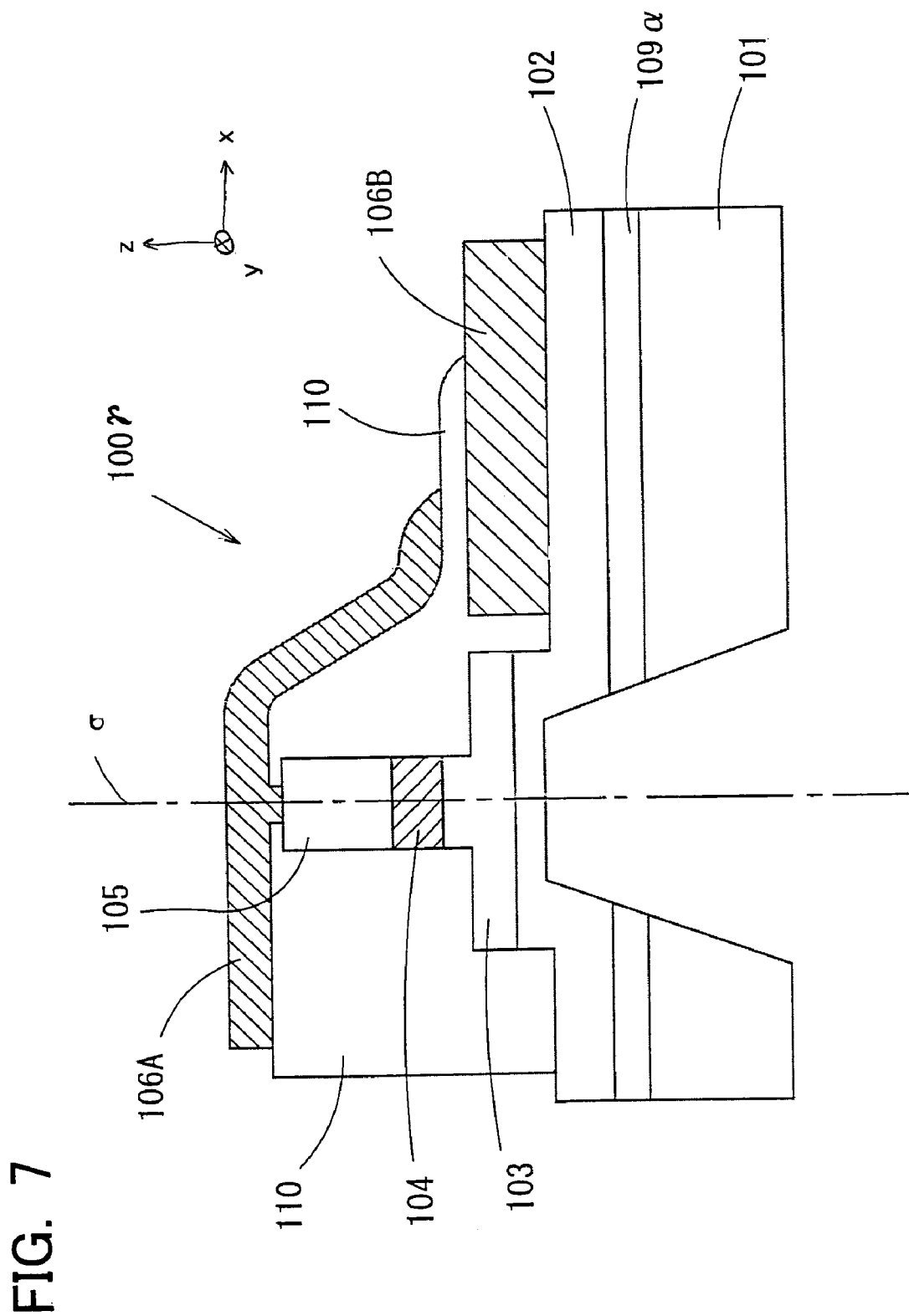
FIG. 7 is a sectional view of a semiconductor laser 100γ according to the sixth embodiment of the present invention.

FIG. 7 shows a sectional view of a semiconductor laser 100γ in a sixth embodiment of the present invention. The semiconductor laser 100γ is formed by partially altering the semiconductor laser 100α in the first embodiment, although no structural difference between the semiconductor laser 100γ and the semiconductor laser 100α can be seen in FIG. 7. The structural difference between the semiconductor laser 100γ and the semiconductor laser 100α can be seen on a cross-sectional surface σ perpendicular to the x axis. The cross-sectional surface σ is arranged parallel to the resonance direction of the laser cavity and divides the laser cavity along the vertical direction (the z axis direction).

Figure 8:
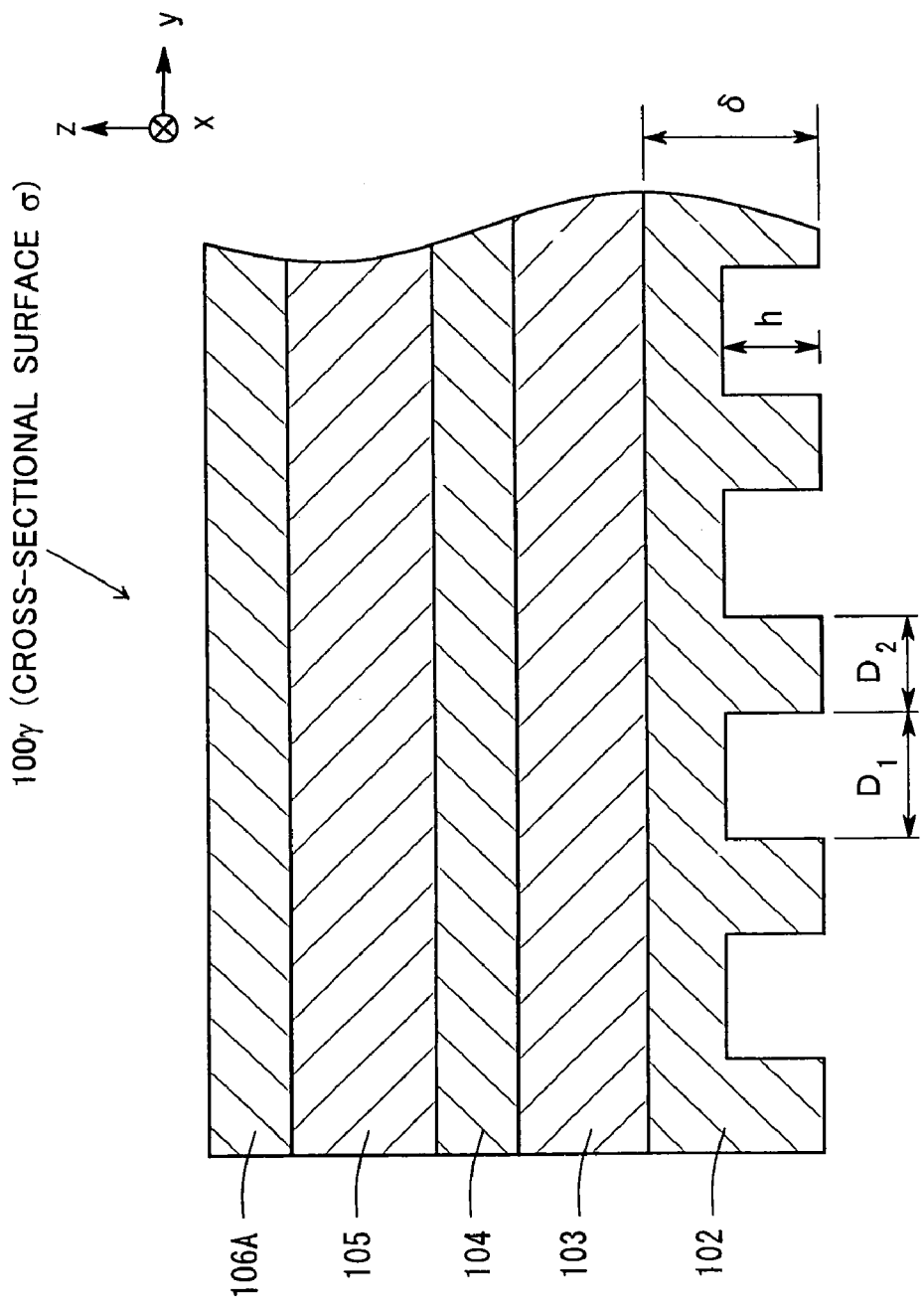
FIG. 8 is a sectional view showing a cross-sectional surface σ of a semiconductor laser 100γ according to the sixth embodiment of the present invention.

FIG. 8 shows a cross-sectional surface σ of a semiconductor laser 100γ. The thicknesses $D_1$ and $D_2$, i.e., the length of y axis direction, of a concave part and a convex part of a distributed feedback structure (DFB structure) having a periodical structure, respectively, may be determined by the following equations:

$$D_1 = k\lambda/(2n_1),$$

$$D_2 = k\lambda/(2n_2) \quad \text{Eq. 8}$$

Here $n_1$ and $n_2$ represent a refractive index of the concave part and a refractive index of the convex part which sticks out toward the lower side, respectively. And k represents an arbitrary positive integer. The value of k may be preferably determined in accordance with conditions such as processing accuracy of an electron beam irradiation device which forms the distributed feedback structure.

In this embodiment, as shown in FIG. 7, because the concave part of the semiconductor laser 100γ may be automatically filled with atmospheric air, $n_1=1.00$, and because the convex part (the bottom part of the n-type contact layer 102) is made by GaN, $n_2=2.40$. When λ=400 nm and k=1, thicknesses $D_1$ and $D_2$ of a period described above may be properly $D_1=200$ nm and $D_2=83$ nm as shown in FIG. 8. Thickness δ of the n-type contact layer 102 may be about 200 nm and height h of the convex part may be about 150 nm.

By employing such structure comprising distributed feedback structure (DFB structure), oscillation occurs in the y axis direction of the distributed feedback structure which oscillates lights to the resonance direction of the resonator, and laser emission becomes almost single mode. That enables to provide sharp and pure emission spectrum.

The effective range of height of the convex part, which is comprised in distributed feedback structure (DFB structure) in the semiconductor laser of the present invention and is formed by sticking out the semiconductor layer toward the lower side, is about 10 nm to 1000 nm. More preferably, it may be about 100 nm to 500 nm. By employing that, effective oscillation owing to distributed feedback structure and interference fringes can be suppressed by controlling thickness δ of the n-type contact layer toward the design parameter Λ.

Seventh Embodiment

Figure 9:
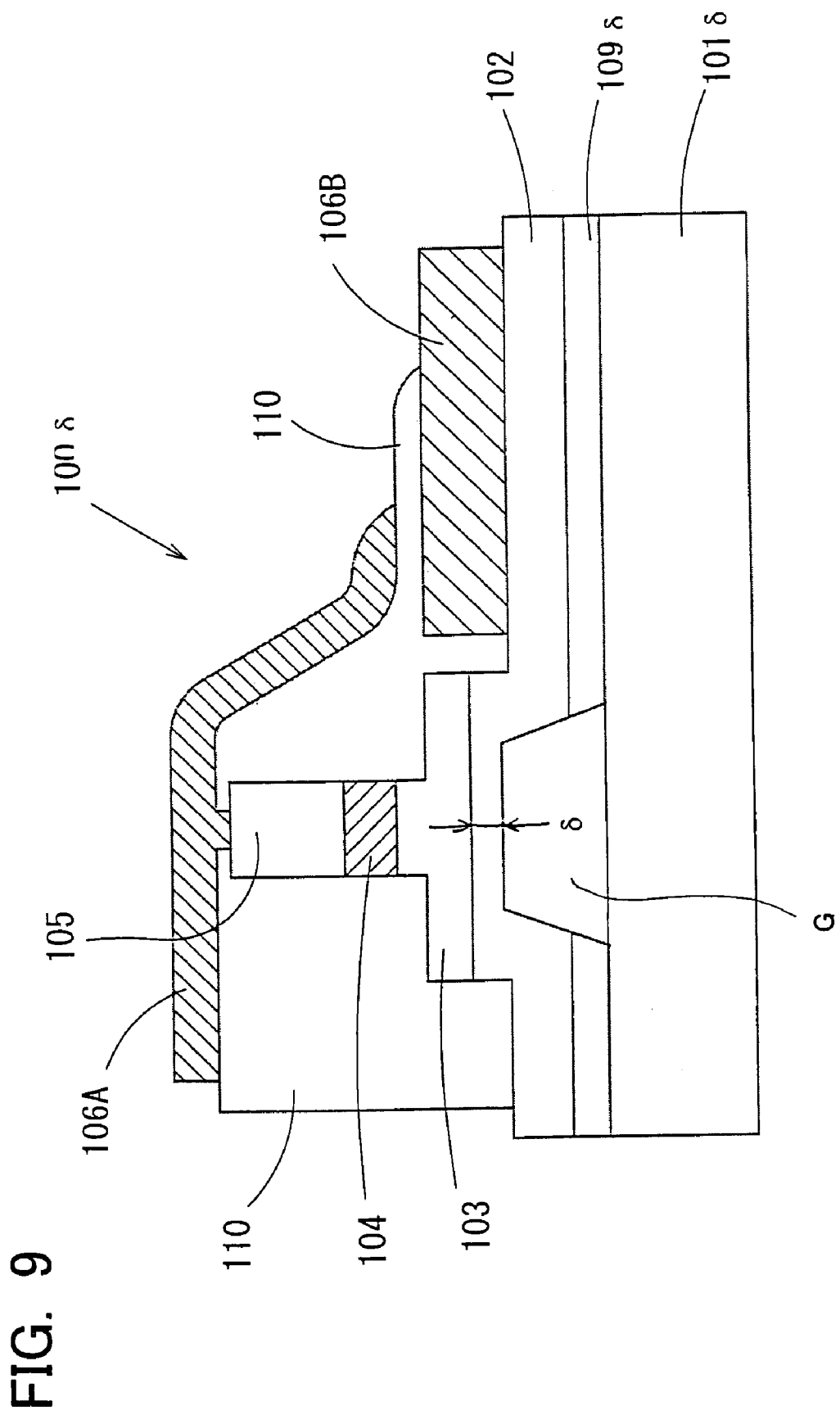
FIG. 9 is a sectional view of a semiconductor laser 100δ according to the seventh embodiment of the present invention.
Figure 10:
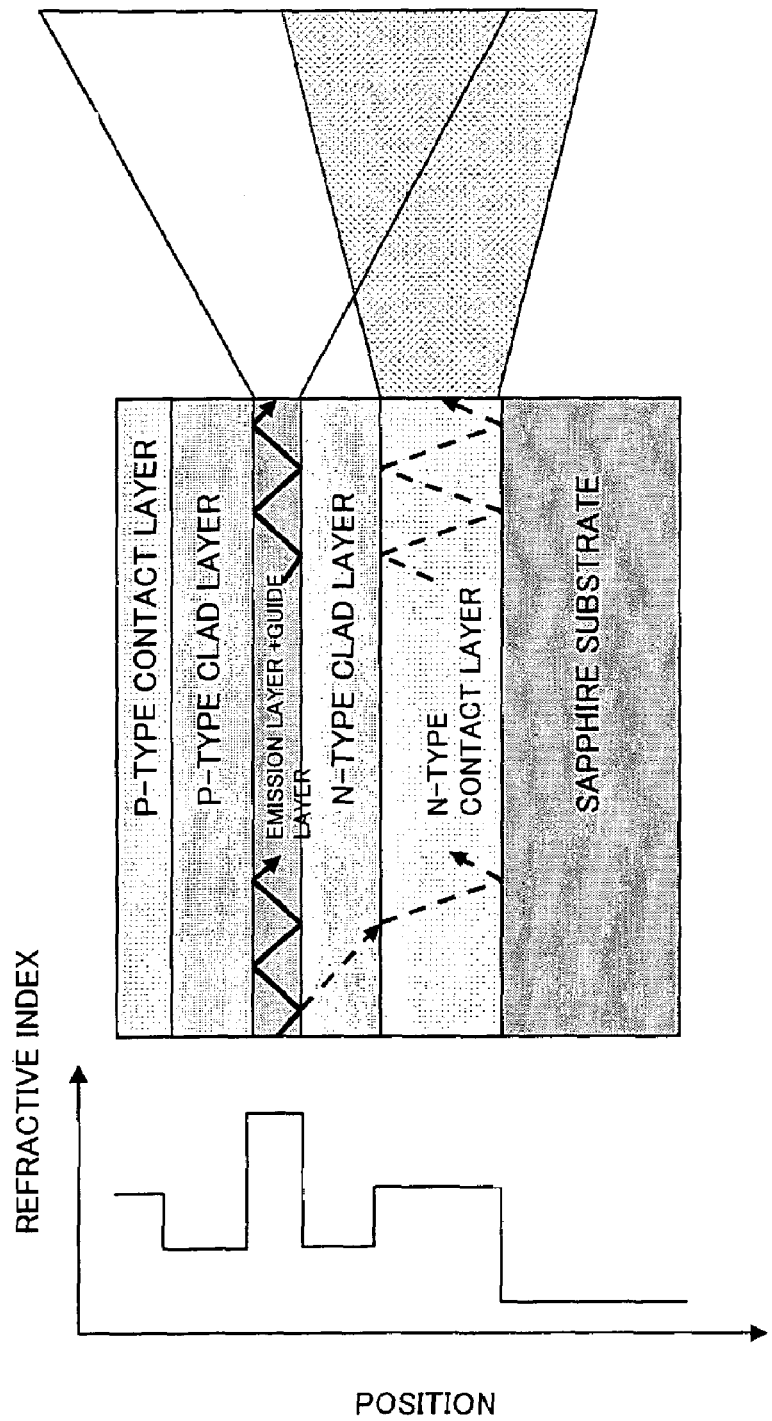
FIG. 10 is a sectional view of a semiconductor laser explaining the phenomenon that ripples are occurred in far field pattern (FFP).

FIG. 9 shows a sectional view of a semiconductor laser 100δ in a seventh embodiment of the present invention. The semiconductor laser 100δ is formed by partially modifying the semiconductor 100α in the first embodiment. In place of the concave part D in the semiconductor laser 100α, a cavity G is formed right under the n-type contact layer 102 placed right under the laser cavity, and the cavity G is filled with air. That is, thickness δ of the n-type contact layer 102 placed right under the laser cavity is arranged to be suitable and optimum as shown in the Eq. 5 by controlling the size (depth) of the cavity G.

Here the crystal growth substrate 101δ is made of sapphire ($Al_2O_3$) and about 50 nm in thickness of GaN is deposited at growth temperature of about 500° C. as the buffer layer 109δ. AlN or AlGaN may be used as the buffer layer.

In order to form the cavity G, a portion of the semiconductor layer (a portion of the buffer layer 109δ and a portion of the n-type contact layer 102) is evaporated by laser irradiation through the substrate 101δ. Both YAG and Excimer may be useful for this laser irradiation, however, Excimer is more preferable in order to obtain flatness of a portion after laser irradiation. When GaN is irradiated by the laser beam, 2GaN resolves into 2Ga and $N_2$ gas. When the laser irradiation is started from the edge of the laser cavity, $N_2$ gas is evaporated from the edge and a window is formed at the edge surface. Successive irradiation along the laser cavity makes a tunnel by evaporation of nitrogen through the tunnel. Ga is removed as a gas of $GaCl_3$ through the tunnel by supplying HCl gas into the tunnel during the laser irradiation. Alternatively, Ga existed in the tunnel may be removed by dilute hydrochloric acid.

According to this embodiment, an n-type contact layer (n-type contact layer 102) of high quality having optimum thickness for suppressing the interference fringes can be obtained without etching off the crystal growth substrate from the back surface.

Eighth Embodiment

In the sixth embodiment, refractive index $n_1$ according to the Eq. 8 is 1.00 by filling the lower part of the laser cavity with air. Alternatively, in place of air, indium tin oxide (ITO) can be arranged right under the n-type contact layer 102 of the semiconductor laser 100γ (FIGS. 7 and 8) in the sixth embodiment. A sputtering equipment may be useful to fill indium tin oxide (ITO).

In this embodiment, however, because refractive index $n_1$ of ITO is 2.02, optimum width $D_1$ which determines the period of distributed feedback structure may be about 99 nm according to the Eq. 8.

Alternatively, a metal material which is suitable for forming an electrode, i.e., copper (Cu), may be placed right under ITO (conductive material). When ITO and copper (Cu) are arranged at portions represented by 107β and 108 shown in FIG. 5, respectively, and other portions of the device is formed to have similar structure as that of the laser shown in FIGS. 7 and 8, actions and effects of both the semiconductor laser 100β (FIG. 5) in the fifth embodiment and the semiconductor laser 100γ (FIGS. 7 and 8) in the sixth embodiment can be obtained at the same time.

As a result, almost single mode laser emission output with whose interference fringes suppressed can be stably obtained.

Other Modified Embodiments

Embodiments of the present invention are not limited to the above-described specific embodiments, and other modification may be carried out as in the following embodiments. Characteristic features, actions and effects of the present invention can also be obtained even by carrying out the below-described modified embodiments.

Modified Embodiment 1

A modification of the semiconductor laser 203 in the fourth embodiment is explained as follows. As mentioned in the fourth embodiment, a negative electrode of the semiconductor laser 203 (FIG. 4) has an arbitrary structure. That is, the crystal growth substrate 101a and the semiconductor multiple film 107' in FIG. 4 may not necessarily be conductive. In the present modified embodiment 1, as mentioned in the latter part of the fourth embodiment, a negative electrode is formed on the surface (upper side) of the semiconductor wafer. Number of laminating thin-film semiconductor layers which are comprised in the semiconductor multiple film 107' in the semiconductor laser 203 (maximum number of m) may be arbitrary. In the present embodiment, the number of laminating semiconductor multiple films is arranged to be 20 to 30. At this time, reflection of the metal layer 106C as shown in a cross-sectional view of FIG. 4 hardly occurs.

A semiconductor laser which fulfills the above described conditions may be, for example, obtained by modifying the semiconductor laser 203 (FIG. 4) explained in the fourth embodiment. The semiconductor laser comprises compositions 1–5 as follows.

(Composition 1) No concave part is formed in the crystal growth substrate. The crystal growth substrate is made of insulation materials such as sapphire and an undoped GaN bulk substrate. An arbitrary insulation material may be used to form the crystal growth substrate in case that it can be used like a well-known material for a crystal growth substrate.

(Composition 2) First, the semiconductor multiple film 107' is formed through crystal growth. That is, at first the semiconductor multiple film 107' is deposited on the crystal growth substrate 101a or on a buffer layer formed thereon. Number of laminating thin-film semiconductor layers which are comprised in the semiconductor multiple film 107' in the semiconductor laser 203 (maximum number of m) is 25.

As the thin-film semiconductor layers comprised in the semiconductor multiple film 107', $Al_xGa_{1-x}N$ ($0 \leq x < 1$) is employed. Aluminum composition ratio $x_m$ of each thin-film semiconductor layers is determined by the following equation 9. Here m represents numbers of thin-film semiconductor layers assigned from the lowermost layer of the crystal growth substrate side in sequence.

Example of Aluminum Composition Ratio $x_m$ $$x_m = 1 - m/25 \ (m=1, 2, 3, \ldots, 25) \quad \text{Eq. 9}$$

(Composition 3) Next, the thick n-type contact layer 102 having thickness δ determined by the Eq.s 4 and 5 is grown on the semiconductor multiple film 107' which is already laminated on the crystal growth substrate to have the same area as that of the crystal growth front.

(Composition 4) The structure of the n-type clad layer 103 and other layers deposited thereon and composition of each electrode correspond to those shown in the fourth embodiment. The negative electrode is formed on the surface (upper side) of the semiconductor wafer as explained above.

(Composition 5) Considering radiation heat, a metal layer is deposited on the almost flat back surface of the crystal growth substrate.

Modified Embodiment 2

In the modified embodiment 1 described above, the semiconductor multiple film 107' may be DBR (distributed Bragg-refrector) in which each layer has the thickness of λ/4n and refractive index changes alternately.

Modified Embodiment 3

The semiconductor multiple film 107 and 107' of the third and fourth embodiment may be dielectric multiple film, respectively.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An edge-emitting type semiconductor laser in which a laser cavity is formed by depositing plural semiconductor layers on a crystal growth substrate, comprising:
    a substrate;
    an n-type contact layer formed on or above said substrate;
    an active layer formed on or above said n-type contact layer; and
    a concave part or cavity part formed at least a part right under said laser cavity;
    wherein said n-type contact layer has a thinner portion formed of at least a part right under said laser cavity and a thicker portion except for said thinner portion, and a thickness of said thinner portion is thinner than a value Λ of a function of a luminous wavelength λ, determined by the formula "$\Lambda = f(\lambda) = \lambda(n^2 - n_{ep}^2)^{-1/2}/2$"

in which λ, n, and $n_{eq}$ are represented by:
    luminous wavelength in said active layer;
    refractive index of said n-type contact layer which depends on said luminous wavelength λ; and
    equivalent refractive index of said n-type contact layer in guided wave mode which depends on said luminous wavelength λ.

2. An edge-emitting type semiconductor laser according to claim 1, wherein said concave part or said cavity part is formed by
evaporating at least a portion of said plural semiconductor layers which is placed right under said laser cavity by laser irradiation.

3. An edge-emitting type semiconductor laser according to claim 1, comprising:
    a concave part which reaches said n-type contact layer from the back surface of said crystal growth substrate and exists at least right beneath said laser cavity.

4. An edge-emitting type semiconductor laser in which a laser cavity is formed by depositing plural semiconductor layers on a crystal growth substrate, comprising:
    an n-type contact layer having a thinner portion formed at least a part right under said laser cavity and a thicker portion except for said thinner portion; and
    a concave part which is formed at the bottom of said laser cavity by removing said crystal growth substrate and said plural semiconductor layers existing at least right beneath said laser cavity from the back surface of said crystal growth substrate; wherein
    a removing process is carried out until a thickness of said thinner portion of said n-type contact layer becomes thinner than a value Λ of a function of a luminous wavelength λ, determined by the formula "$\Lambda = f(\lambda) = \lambda(n^2 - n_{ep}^2)^{-1/2}/2$"

in which λ, n, and $n_{eq}$ are represented by:
    luminous wavelength of an active layer;
    refractive index of said n-type contact layer which depends on said luminous wavelength λ; and
    equivalent refractive index of said n-type contact layer in guided wave mode which depends on said luminous wavelength λ.

5. An edge-emitting type semiconductor in which a laser cavity is formed by depositing plural semiconductor layers on a crystal growth substrate, comprising:
    a substrate;
    an n-type contact layer formed on or above said substrate; and
    an active layer formed on or above said n-type contact layer;
    wherein a thickness of at least a part of said n-type contact layer which is right under said laser cavity is thinner than a value Λ of a function of a luminous wavelength λ, determined by the formula "$\Lambda = f(\lambda) = \lambda(n^2 - n_{ep}^2)^{-1/2}/2$"

in which λ, n, and $n_{eq}$ are represented by:
    luminous wavelength in said active layer;
    refractive index of said n-type contact layer which depends on said luminous wavelength λ; and
    equivalent refractive index of said n-type contact layer in guided wave mode which depends on said luminous wavelength λ, and
    wherein a concave part or a cavity part is formed at least a part right under said laser cavity;
    the semiconductor laser further comprising an n-type clad layer wherein a dielectric film or a semiconductor film having smaller refractive index than that of said n-type clad layer is formed at the bottom of said n-type contact layer exposed in said concave part.

6. An edge-emitting type semiconductor in which a laser cavity is formed by depositing plural semiconductor layers on a crystal growth substrate, comprising:
- a concave part which is formed at the bottom of said laser cavity by removing said crystal growth substrate and said plural semiconductor layers existing at least right beneath said laser cavity from the back surface of said crystal growth substrate; wherein
- a removing process is carried out until a thickness of an n-type contact layer becomes thinner than a value $\Lambda$ of a function of a luminous wavelength $\lambda$, determined by the formula "$\Lambda = f(\lambda) = \lambda(n^2 - n_{ep}^2)^{-1/2}/2$"

in which $\lambda$, n, and $n_{eq}$ are represented by:
- luminous wavelength of an active layer;
- refractive index of said n-type contact layer which depends on said luminous wavelength $\lambda$; and
- equivalent refractive index of said n-type contact layer in guided wave mode which depends on said luminous wavelength $\lambda$;
- said semiconductor laser further comprising an n-type clad layer wherein a dielectric film or a semiconductor film having smaller refractive index than that of said n-type clad layer is formed at the bottom of said n-type contact layer exposed in said concave part.

7. An edge-emitting type semiconductor laser according to claim 3, wherein a metal layer or a metal part is formed in at least one portion or the entire portion of said concave part.

8. An edge-emitting type semiconductor laser according to claim 4, wherein a metal layer or a metal part is formed in at least one portion or the entire portion of said concave part.

9. An edge-emitting type semiconductor laser according to claim 7, wherein a negative electrode is formed by using said metal layer or said metal part.

10. An edge-emitting type semiconductor laser according to claim 8, wherein a negative electrode is formed by using said metal layer or said metal part.

11. An edge-emitting type semiconductor laser in which a laser cavity is formed by depositing plural semiconductor layers on a crystal growth substrate, comprising:
- a substrate;
- an n-type contact layer formed on or above said substrate; and
- an active layer formed on or above said n-type contact layer; wherein
- a thickness of at least a part of said n-type contact layer which is right under said laser cavity is thinner than a value $\Lambda$ of a function of a luminous wavelength $\lambda$, determined by the formula "$\Lambda = f(\lambda) = \lambda(n^2 - n_{ep}^2)^{-1/2}/2$"

in which $\lambda$, n, and $n_{eq}$ are represented by:
- luminous wavelength of an active layer;
- refractive index of said n-type contact layer which depends on said luminous wavelength $\lambda$; and
- equivalent refractive index of said n-type contact layer in guided wave mode which depends on said luminous wavelength $\lambda$;
- and wherein the semiconductor laser further comprises:
- a negative electrode formed on the exposed surface of said n-type contact layer whose upper surface is exposed through etching treatment from the upper side of said plural semiconductor layers; and
- a semiconductor layer comprising a p-type or undoped Group III nitride compound semiconductor formed between said n-type contact layer and said crystal growth substrate.

12. An edge-emitting type semiconductor laser in which a laser cavity is formed by depositing plural semiconductor layers on a crystal growth substrate, comprising:
- a substrate;
- an n-type contact layer formed on or above said substrate; and
- an active layer formed on or above said n-type contact layer;
- wherein a thickness of at least a part of said n-type contact layer which is right under said laser cavity is thinner than a value $\Lambda$ of a function of a luminous wavelength $\lambda$, determined by the formula "$\Lambda = f(\lambda) = \lambda(n^2 - n_{ep}^2)^{-1/2}/2$"

in which $\lambda$, n, and $n_{eq}$ are represented by:
- luminous wavelength in said active layer;
- refractive index of said n-type contact layer which depends on said luminous wavelength $\lambda$; and
- equivalent refractive index of said n-type contact layer in guided wave mode which depends on said luminous wavelength $\lambda$;
- said semiconductor laser further comprising:
- a concave part which reaches said n-type contact layer from the back surface of said crystal growth substrate and exists at least right beneath said laser cavity;
- a negative electrode formed on the exposed surface of said n-type contact layer whose upper surface is exposed through etching treatment from the upper side of said plural semiconductor layers; and
- a semiconductor layer comprising a p-type or undoped Group III nitride compound semiconductor formed between said n-type contact layer and said crystal growth substrate.

13. An edge-emitting type semiconductor laser in which a laser cavity is formed by depositing plural semiconductor layers on a crystal growth substrate, comprising:
- a concave part which is formed at the bottom of said laser cavity by removing said crystal growth substrate and said plural semiconductor layers existing at least right beneath said laser cavity from the back surface of said crystal growth substrate; wherein
- removing process is carried out until thickness of an n-type contact layer becomes thinner than a value $\Lambda$ of a function of a luminous wavelength $\lambda$, determined by the formula "$\Lambda = f(\lambda) = \lambda(n^2 - n_{ep}^2)^{-1/2}/2$"

in which $\lambda$, n, and $n_{eq}$ are represented by:
- luminous wavelength of an active layer;
- refractive index of said n-type contact layer which depends on said luminous wavelength $\lambda$; and
- equivalent refractive index of said n-type contact layer in guided wave mode which depends on said luminous wavelength $\lambda$,
- a negative electrode formed on the exposed surface of said n-type contact layer whose upper surface is exposed through etching treatment from the upper side of said plural semiconductor layers; and
- a semiconductor layer comprising a p-type or undoped Group III nitride compound semiconductor formed between said n-type contact layer and said crystal growth substrate.

14. An edge-emitting type semiconductor laser according to claim 1, wherein thickness of said n-type contact layer at the part right beneath said laser cavity is in a range from $\Lambda/5$ to less than $\Lambda$.

15. An edge-emitting type semiconductor laser according to claim 3, wherein thickness of said n-type contact layer at the part right beneath said laser cavity is in a range from $\Lambda/5$ to less than $\Lambda$.

16. An edge-emitting type semiconductor laser according to claim 2, wherein thickness of said n-type contact layer at the part right beneath said laser cavity is in a range from $\Lambda/5$ to less than $\Lambda$.

17. An edge-emitting type semiconductor laser according to claim 4, wherein thickness of said n-type contact layer at the part right beneath said laser cavity is in a range from $\Lambda/5$ to less than $\Lambda$.

18. An edge-emitting type semiconductor laser according to claim 1, wherein a distributed feedback structure (DFB structure), which oscillates lights along a resonance direction of said laser cavity, is formed at at least a portion of the bottom of said n-type contact layer placed right under said laser cavity.

19. An edge-emitting type semiconductor laser according to claim 18, wherein thickness of said n-type contact layer at the part right beneath said laser cavity is in a range from $\Lambda/5$ to less than $\Lambda$.

* * * * *